United States Patent
Yamana et al.

(10) Patent No.: US 9,166,196 B2
(45) Date of Patent: *Oct. 20, 2015

(54) ORGANIC ELECTROLUMINESCENCE DEVICE

(75) Inventors: Masahito Yamana, Hyogo (JP); Daiki Kato, Osaka (JP); Masahiro Nakamura, Eindhoven (NL); Takahiro Koyanagi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 170 days.

This patent is subject to a terminal disclaimer.

(21) Appl. No.: 14/006,112

(22) PCT Filed: Dec. 16, 2011

(86) PCT No.: PCT/JP2011/079195
§ 371 (c)(1),
(2), (4) Date: Sep. 19, 2013

(87) PCT Pub. No.: WO2012/127746
PCT Pub. Date: Sep. 27, 2012

(65) Prior Publication Data
US 2014/0008628 A1 Jan. 9, 2014

(30) Foreign Application Priority Data
Mar. 23, 2011 (JP) .................................. 2011-065055

(51) Int. Cl.
*H05B 33/00* (2006.01)
*H01L 51/52* (2006.01)
*H01L 51/00* (2006.01)

(52) U.S. Cl.
CPC ........ *H01L 51/5262* (2013.01); *H01L 51/0096* (2013.01); *H01L 51/5225* (2013.01); *H01L 2251/5315* (2013.01); *Y02E 10/549* (2013.01)

(58) Field of Classification Search
None
See application file for complete search history.

(56) References Cited

U.S. PATENT DOCUMENTS

| 7,511,419 B2 * | 3/2009 | Takei et al. .................. 313/506 |
| 2004/0012980 A1 | 1/2004 | Sugiura et al. |

(Continued)

FOREIGN PATENT DOCUMENTS

| JP | 2003-036969 | 2/2003 |
| JP | 2004-342522 | 12/2004 |
| JP | 2006-269251 | 10/2006 |

(Continued)

OTHER PUBLICATIONS

International Search Report for PCT/JP2011/079195, mailing date is Feb. 7, 2012.

*Primary Examiner* — Ashok Patel
(74) *Attorney, Agent, or Firm* — Greenblum & Bernstein, P.L.C.

(57) ABSTRACT

An organic EL device includes a metal layer which is provided with a nano-order-sized unevenness on one surface and plural organic layers which include a light emitting layer provided on the one surface side of the metal layer, and a height of each unevenness at respective interfaces in the organic layer is made smaller than an unevenness provided on the metal layer. According to the above configuration, the unevenness on one surface of the metal layer changes a surface plasmon to a propagation light and a light loss can be suppressed, and moreover, each unevenness of respective interfaces of the respective organic layers is made smaller than the unevenness on the surface of the metal layer, so that a short circuit inside the device can be suppressed.

8 Claims, 2 Drawing Sheets

(56) References Cited

U.S. PATENT DOCUMENTS

| | | |
|---|---|---|
| 2004/0227462 A1 | 11/2004 | Utsumi et al. |
| 2005/0161693 A1 | 7/2005 | Sugiura et al. |
| 2009/0021137 A1 | 1/2009 | Sugiura et al. |
| 2011/0114921 A1* | 5/2011 | Yang et al. ............ 257/40 |

FOREIGN PATENT DOCUMENTS

| | | |
|---|---|---|
| JP | 2007-234254 | 9/2007 |
| JP | 2008-166343 | 7/2008 |
| JP | 2009-9861 | 1/2009 |
| JP | 2010-198974 | 9/2010 |

* cited by examiner

1: ORGANIC EL DEVICE
2: METAL LAYER
2': UNEVENNESS
3: ORGANIC LAYER
31: LIGHT EMITTING
    LAYER

ORGANIC ELECTROLUMINESCENCE DEVICE

TECHNICAL FIELD

The present invention relates to an organic electroluminescence device which can enhance a light extraction efficiency.

BACKGROUND ART

In an electroluminescence (EL) device, a light emitting layer is formed on a transparent substrate so as to be interposed between an anode and a cathode. When a voltage is applied between the electrodes, light is emitted by exciters generated by recombination of holes and electrons injected as carriers to the light emitting layer. EL devices are generally classified into organic EL devices in which an organic substance is used as a fluorescent substance of a light emitting layer, and inorganic EL devices in which an inorganic substance is used as a fluorescent substance of a light emitting layer. In particular, organic EL devices are capable of emitting light of high luminance with a low voltage, and various colors of emitted light are obtained therefrom depending on the types of fluorescent substances. In addition, it is easy to manufacture organic EL devices as planar light emitting panels, and thus organic EL devices are used as various display devices and backlights. Furthermore, in recent years, organic EL devices designed for high luminance have been realized, and attention has been paid to use of these organic EL devices for lighting apparatuses.

FIG. 4 shows a cross-sectional configuration of a common organic EL device. In an organic EL device 101, a translucent anode layer 104 is located on a translucent substrate 105, and an organic layer 103 which is made up of a hole injection layer 133, a hole transport layer 132, and a light emitting layer 131 is located on the anode layer 104. A light-reflective cathode layer 102 is located on the organic layer 103. When a voltage is applied between the anode layer 104 and the cathode layer 102, light which is emitted by the organic layer 103 passes through the anode layer 104 and the substrate 105 and then is taken out. In general, a metal material such as aluminum (Al), silver (Ag), or the like, which has a high light reflectivity and electrical conductivity, is used for the cathode layer 102.

However, it is known that in the metal material having the high electrical conductivity, plasmons, which are collective oscillations of free electrons in the metal behaving as pseudo particles, occur. That is to say, it is known that when light of a predetermined wavelength enters a surface of a metal material, a wave of electron density pattern, namely, a surface plasmon is excited, and the surface plasmon propagates through a surface of the metal and is inactivated (refer to $10^{th}$ Symposium on Organic EL Regular Meeting Proceeding, S9-2, for example). Thus, in the organic EL device 101 shown in FIG. 4, part of light which enters the cathode layer 102 in light emitted by the light emitting layer 131 (indicated by a star) propagates through a surface of the cathode layer 102 and is inactivated (indicated by arrows), so that it is not taken out as effective light, and thus light extraction efficiency is often reduced.

In order to suppress a light loss caused by the surface plasmon, there is a thought that a nano-order unevenness is provided on a substrate, and an organic layer, which includes an anode layer and a light emitting layer, and a cathode layer which is formed of a metal are laminated on the unevenness to form a corrugated structure at each interface (for example, refer to Japanese Laid-Open Patent Publication No. 2009-9861: Patent Document 1). According to the above configuration, the surface plasmon occurred on the surface of the metal changes to a propagation light by the uneven corrugated structure, so that the light loss caused by the surface plasmon can be suppressed.

However, in the uneven corrugated structure described in the above patent document 1, since the unevenness is formed at the interfaces of all the layers, a film thickness becomes ununiformed and a short circuit occurs easily, so that there is a possibility that reliability of a device in which the above organic EL device is incorporated is reduced.

DISCLOSURE OF THE INVENTION

The present invention is to solve the problem described above, and an object of the present invention is to provide an organic EL device which can suppress light loss caused by a surface plasmon occurred on a surface of a metal, enhance an efficiency of extracting light out of the device, further prevent a short circuit in the device, and thus has high reliability.

To solve the above problem, 1. An organic electroluminescence device, including: a metal layer which is provided with a nano-order-sized unevenness on one surface; and plural organic layers which include a light emitting layer and are provided on a side of the one surface of the metal layer; wherein a height of each unevenness at respective interfaces in the organic layer is made smaller than an unevenness provided on the metal layer.

It is preferable that in the organic electroluminescence device, the unevenness of the metal layer is formed to have a height of 10 to 200 nm and a width larger than the height of the unevenness.

It is preferable that in the organic electroluminescence device, the metal layer is a first electrode layer which applies a voltage to the organic layer, and a second electrode layer which is paired with the first electrode layer is formed across the organic layer.

It is preferable that in the organic electroluminescence device, the metal layer is a substrate to form the organic layer.

It is preferable that in the organic electroluminescence device, the organic layer is provided on a side of the one surface of the metal layer across an insulating layer and the first electrode layer which applies the voltage to the organic layer, and a second electrode layer is provided on a side of the organic layer opposite to the side of the organic layer which contacts the first electrode layer.

It is preferable that in the organic electroluminescence device, the metal layer has light reflectivity and the first electrode layer has translucency.

It is preferable that in the organic electroluminescence device, the height of each unevenness at the respective interfaces of the organic layer is formed to be smaller as the unevenness gets closer to the second electrode layer.

It is preferable that in the organic electroluminescence device, the organic layer or the second electrode layer is formed of a coating material.

According to the present invention, the unevenness on one surface of the metal layer changes a surface plasmon to a propagation light and a light loss can be suppressed, and moreover, each unevenness of respective interfaces of the respective organic layers is made smaller than the unevenness on the surface of the metal layer, so that a short circuit inside the device can be suppressed.

DESCRIPTION OF THE PREFERRED EMBODIMENTS

Figure 1:
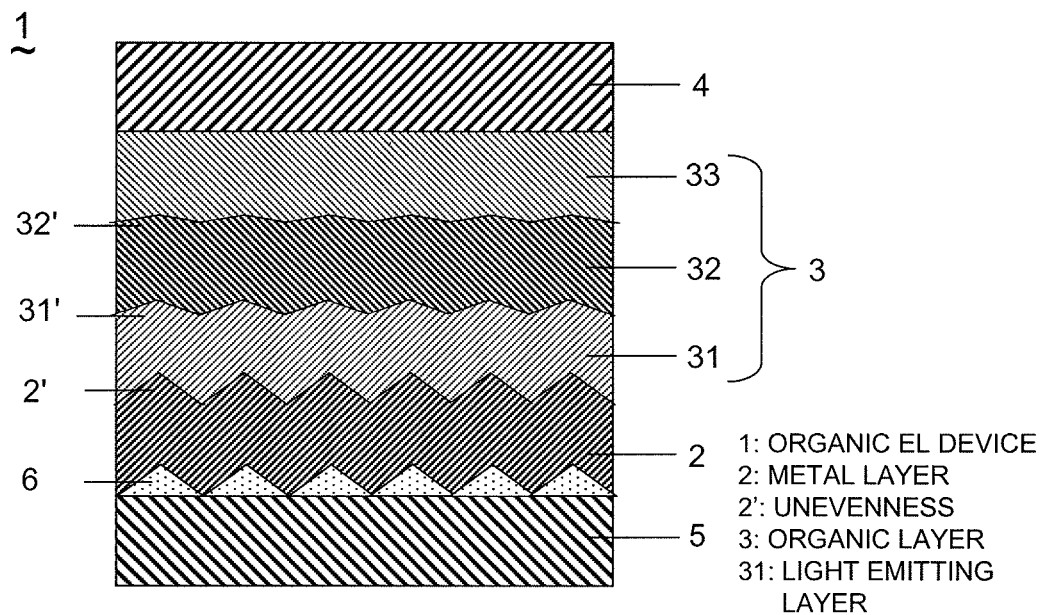
FIG. 1 is a side sectional view of an organic electroluminescence device according to a first preferred embodiment of the present invention.

An organic electroluminescence device (abbreviated as the organic EL device hereinafter) according to a first preferred embodiment of the present invention is described with reference to FIG. 1. An organic EL device 1 of the present preferred embodiment includes a metal layer 2 provided with a nano-order-sized unevenness 2' on one surface, and plural organic layers 31, 32, and 33 (collectively referred to as an organic layer 3) on the one surface side of the metal layer 2. These organic layers 3 include a layer which is a light emitting layer (abbreviated as a light emitting layer 31).

In the organic EL device 1, each height of the unevennesses 31' and 32' at the respective interfaces of the organic layer 3 is configured to be smaller than the unevenness 2' located on the metal layer 2. In the present preferred embodiment, the metal layer 2 is a first electrode layer which applies a voltage to the organic layer 3, and a second electrode layer 4 which is paired with the metal layer 2 (the first electrode layer) across the organic layer 3. Moreover, the metal layer 2, the organic layer 3, and the second electrode 4 are formed on the substrate 5. The organic layer 3 has the light emitting layer 31, a hole transport layer 32, and the hole injection layer 33, and these are located on the metal layer 2 in the above order. In the above configuration, the metal layer 2 (the first electrode layer) functions as a cathode for injecting an electron into the organic layer 3 and the second electrode layer 4 functions as an anode for injecting a hole into the hole injection layer 33.

In the present preferred embodiment, an unevenness 6 (as will hereinafter be described in detail) is formed on the substrate 5 firstly, a metal material which constitutes the metal layer 2 is deposited, for example, on the substrate 5 on which the unevenness 6 is formed to form a layer, which has a substantially uniform film thickness, on a surface of the substrate 5. Accordingly, an unevenness 2' which has substantially the same configuration with the unevenness 6, which is formed on the substrate 5, is formed on a surface of the metal layer 2 opposite to the surface which contacts the substrate 5.

A rigid transparent glass plate such as a soda glass, a non-alkali glass, or the like, for example, is used as the substrate 5, however, the constitutional material is not limited to the above. For example, an optional material such as a flexible transparent plastic plate such as polycarbonate, polyethylene terephthalate, or the like, or a metal film made up of Al, Copper (Cu), stainless, or the like may be used.

A method of forming the unevenness 6 on the substrate 5 includes a method of applying an UV curable resin or a thermoplastic resin to the substrate 5 in advance, for example, and making the nano-order-sized unevenness 6 by an UV nanoimprint or a heat nanoimprint. Moreover, for example, a method of applying nanosized particles such as silica or magnesium floride on the substrate 5 may be used. According to these methods, the unevenness 6 and the substrate 5 are configured as separate members, however, when the substrate 5 is formed of a material such as a resin material, for example, on which a surface processing can be performed, the unevenness 6 can be formed on the substrate 5 itself, and in this case, the unevenness 6 and the substrate 5 are integrally configured. Moreover, the method is not limited to the above methods, however, any method of applicable as long as the unevenness 6 having the desired configuration can be formed.

A height and a width of the unevenness 6 are preferably set uniformly or periodically when a specific wavelength dependence or output angle dependence is required in a device in which the organic EL device 1 is incorporated. In contrast, when the light extraction efficiency is enhanced as equally as possible at a broad wavelength and a total output angle, the height and the width of the unevenness 6 are preferably set randomly. Moreover, the height of the unevenness 6 is preferably smaller than 10 to 200 nm, which is a film thickness of a common organic layer 3, and in particular, it is preferably be 10 to 100 nm or less. The width of the unevenness 6 is preferably larger than the height of the unevenness 6.

The height and the width of the unevenness 6 which are set in the way described above are reflected in the unevenness 2' at the interface of the metal layer 2 contacting the organic layer 3 (the light emitting layer 31) by reason that the metal layer 2 is substantially uniformly provided on the substrate 5. That is to say, the unevenness 2' of the metal layer 2 is formed to have the height of 10 to 200 nm and the width larger than the height of the unevenness 2'. When the height of the unevenness 2' is less than 10 nm, the reduction of the light loss caused by the surface plasmon cannot be expected, and when the height of the unevenness 2' is more than 200 nm, it is higher than the film thickness of the organic layer, so that a short circuit in the device occurs easily. Also, when the width of the unevenness 2' is smaller than its height, the short circuit in the device occurs easily. Accordingly, the unevenness 2' of the metal layer 2 is formed to have the height of 10 to 200 nm and the width larger than the height of the unevenness 2' so that the light loss is reduced and moreover, the short circuit can be suppressed.

Aluminum (Al), silver (Ag), or a compound including these metals may be used as a material of the metal layer 2 (the first electrode layer (cathode)). Moreover, it may also be made as a laminated structure or the like of combining Al and the other electrode material. The combination of the electrode material includes a laminated body of an alkali metal/Al, alkali metal/silver, alkali metal halide/Al, alkali metal oxide/Al, alkali earth metal/Al, rare-earth metal/Al, an alloy of these metallic series and other metal, or the like. In particular, it includes, for example, sodium (Na), sodium-potassium (K) alloy, lithium (Li), a laminated body of magnesium (Mg) or the like and Al, Mg—Ag mixture, Mg-indium mixture, Al—Li alloy, LiF/Al mixture/laminated body, or Al/$Al_2O_3$ mixture. Moreover, also as for the other laminated conductive material other than the above laminated conductive materials, it is preferable to insert a layer which enhances the injection of the electrons from the metal layer 2 (cathode) into the light emitting layer 31, that is to say, an electron injection layer (not shown) between the cathode and the light emitting layer. A material constituting the electron injection layer includes, for example, a material in common with that of the above metal layer 2, a metal oxide such as titanic oxide, zinc oxide, or the like, an organic semiconductor material in which a dopant, which enhances the electron injection like the above materials, is mixed, however, the material is not limited to the above.

A nano-order-sized unevenness may also be formed on the surface of the metal layer 2 after forming the metal layer 2 on the substrate 5 without forming the unevenness 6 on the substrate 5. For example, the metal layer 2 may be cohered by heat using Ag, or a mold is impressed on a surface of a metal such as Al or Ag to transcribe the unevenness structure.

In the present preferred embodiment, the metal layer 2 is provided on the substrate 5, and on this metal layer 2 (the first electrode layer (cathode)), the organic layer 3 including the light emitting layer 31 and so on and the second electrode layer 4 (anode) are laminated in order. The second electrode layer 4 is formed of a translucent conductive material, and the metal layer 2 (the first electrode layer) is formed of a light-reflective material. In this configuration, the light emitted by the organic layer 3 is reflected by the metal layer 2 or directly goes on, passes through the second electrode layer 4, and then is taken out the outside of the organic EL device 1.

In the present preferred embodiment, the organic layer 3 and the second electrode layer 4 is preferably formed of a coating material. In this way, the organic layer 3 and the second electrode layer 4 may be deposited by a coating method such as a spin coating, a spray coating, a die coating, a gravure printing, and thus the plural layers can be formed efficiently. Moreover, the coating enables the unevennesses 31' and 32' at the respective interfaces of the organic layer 3 to have the height smaller than those of the unevenness 2' of the metal layer 2 and to be smaller as they get closer to the second electrode layer 4. That is to say, when the organic material constituting the light emitting layer 31 is applied to a surface of the unevenness 2' of the metal layer 2, the organic material collects in the concave portion in the unevenness 2' of the metal layer 2, so that the film thickness of the light emitting layer 31 is slightly thicker than that on the convex portion in the unevenness 2' of the metal layer 2, and as a result, the surface of the unevenness 31' of the light emitting layer 31 has the smaller unevenness than the surface of the unevenness 2' of the metal layer 2. In the same manner, the surface of the unevenness 32' of the hole transport layer 32 is smoother than the surface of the unevenness 31' of the light emitting layer 31, and the layer which is closer to the second electrode layer 4 has the smoother surface. In this way, the interface between the second electrode layer 4 and the layer contacting the second electrode layer 4 (the hole injection layer 33 in the present preferred embodiment) in the organic layer 3 is flat, so that the short circuit at this interface can be suppressed efficiently.

The organic EL material constituting the light emitting layer 31 includes, for example, polyparaphenylene vinylene derivatives, polythiophene derivatives, polyparaphenylene derivatives, polysilane derivatives, polyacetylene derivatives, polyfluorene derivatives, polyvinylcarbazole derivatives, and polymers of the above described dyes and metal complex emitting materials, or the like, anthracene, naphthalene, pyrene, tetracene, coronene, perylene, phthaloperylene, naphthaloperylene, diphenylbutadiene, tetraphenylbutadiene, coumarin, oxadiazole, bisbenzoxazorine, bisstyryl, cyclopentadiene, quinoline metal complex, tris(8-hydroxyquinolinate)aluminum complex, tris(4-methyl-8-quinolinate)aluminum complex, tris(5-phenyl-8-quinolinate)aluminum complex, aminoquinoline metal complex, benzoquinoline metal complex, tri(p-terphenyl-4-yl)amine, pyrane, quinacridone, rubrene, and these derivatives, or 1-aryl-2,5-di(2-thienyl)pyrrole derivative, distyrylbenzene derivative, styrylarylene derivative, styrylamine derivative, and compounds having groups made up of these light emitting compounds in part of the molecules. Moreover, in addition to the compounds derived from fluorescent dyes typified by the above compounds, so-called phosphorescence emitting materials, for example, emitting materials such as Ir complex, Os complex, Pt complex, and europium complex, or compounds or polymers having these materials within the molecules may also be used preferably. These materials may be appropriately selected and used as necessary.

A low molecule to high molecule material having small LUMO may be used as a material constituting the hole transport layer 32. Such a material includes, for example, a polymer which includes aromatic amine such as polyarylene derivative having aromatic amine in the side or main chain of such polyvinyl carbazole (PVCz), polypyridine, or polyaniline, however, the material is not limited to the above.

A material constituting the hole injection layer 33 includes an organic material including thiophene, triphenylmethane, hydrazoline, arylamine, hydrazine, stilbene, and triphenylamine, for example. In particular, it includes an aromatic amine derivative such as polyvinyl carbazole (PVCz), polyethylenedioxythiophene: polystyrenesulfonate (PEDOT: PSS), and TPD, and the above material may be used singly or two or more of them may be used in combination.

A conductive material constituting the second electrode layer 4 (anode) includes microparticles of a metal such as Ag, indium tin oxide (ITO), indium zinc oxide (IZO), tin oxide, or Au, a conductive polymer, a conductive organic material, a dopant- (donor- or acceptor-) containing organic layer, a mixture of a conductor and a conductive organic material (including a polymer), and a mixture of these conductive material and a non-conductive material, however, the conductive material is not limited to the above. The non-conductive material includes acrylic resin, polyethylene, polypropylene, polyethylene terephthalate, polymethyl methacrylate, polystyrene, polyther sulfone, polyarylate, polycarbonate resin, polyurethane, polyacrylonitrile, polyvinyl acetal, polyamide, polyimide, diacrylphthalate resin, cellulose resin, polyvinyl chloride, polyvinylidene chloride, polyvinyl acetate, other thermoplastic resin, and copolymers of two or more of the monomers constituting these resins, however, the non-conductive material is not limited to the above. Moreover, a doping using a dopant such as sulfonic acid, Lewis acid, protonic acid, alkali metal, alkali earth metal, or the like may be performed to enhance the conductivity. The dopant is not also limited to the above.

In addition to the above conductive material, a metal material such as Ag or Cu or a conductive material such as carbon, which has a grid structure (mesh structure) to have a thin line shape, may also be used. A size of a width of the thin line is preferably be substantially 1 to 100 μm in terms of the conductivity and the translucency. An optional pitch and aspect ratio of the thin line may be used. The grid structure can be formed of a conductive paste containing the above material using a screen printing or the like, however, the method of forming the grid structure is not limited to the above.

According to the present preferred embodiment, the nano-order-sized unevenness 2' is provided on the surface of the metal layer 2 (the first electrode layer), so that the surface plasmon occurred on the surface of the metal changes to the propagation light, and thus the light loss caused by the surface plasmon can be suppressed and the efficiency of extracting the light out of the device can be enhanced. Moreover, each unevenness at the interfaces of the respective layers in the organic layer 3 is smaller than the unevenness 2' of the metal layer 2, so that the short circuit inside the device can be suppressed. Furthermore, the coating process is performed on the organic layer 3 or the second electrode layer 4 using the coating material, thus each unevenness at the interfaces of the layers in the organic layer 3 can be made smaller than the unevenness 2' of the metal layer 2.

Figure 4:
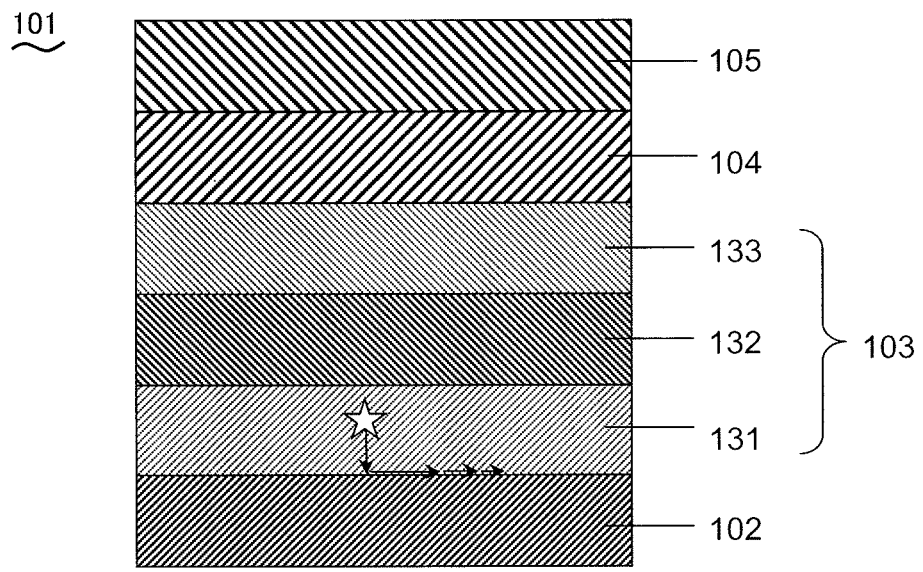
FIG. 4 is a side sectional view of a conventional organic electroluminescence device.

The common organic EL device 101 shown in FIG. 4 is made by forming the translucent anode layer 104 on the substrate 105 and forming the organic layer 103 on the anode layer 104. In this case, a surface roughness on the anode layer 104 needs to be reduced to suppress the short circuit in a step of forming the organic layer 103 on the anode layer 104. In general, the anode portion is formed by patterning to define a light emitting area and prevent the short circuit with the cathode layer 102. This patterning includes a bank formation or an etching after the film formation and printing such as a screen printing or the like. Normally, the bank formation and the etching has steps of photoresist application and an immersion in a developing solution and a photoresist stripping solution, and there is a possibility that the anode formed by a wet process is easily damaged and characteristics as the anode is degraded. In contrast, in the patterning by the printing, for example when the screen printing is used, a surface unevenness caused by a mesh of the printing sometimes occurs. Moreover, when a gravure printing, a die coating, or the like is used, a film thickness level difference sometimes occurs at the beginning and the ending of the coating. The surface roughness and the film thickness level difference cause the occurrence of the short circuit when the organic layer 103 is laminated on the anode layer 104 to form the organic EL device 101.

In any printing method described above, when viscosity of a printing ink is reduced, a leveling after coating can be improved. However, when the viscosity is reduced, the film is difficult to thicken. Normally, when a conductive high polymer material such as a highly-conductive type PEDOT: PSS or the like, which is frequently used, is used as the electrode material formed by the wet process, the film thickness of substantially 500 to 1000 nm is required to obtain the conductivity equal to that of a translucent oxide conductive film such as ITO having 100 to 200 nm film thickness. Accordingly, when this type of the conductive high polymer material is used, sometimes the viscosity of the printing ink cannot be reduced easily. Moreover, when the high conductive material is used, the film can be thinned comparatively, so that the viscosity of the printing ink can be reduced, however in this case, there are problems of wettability with a base and an ink bleed, for example, so that it is not easy to form the anode layer 10 stably.

In contrast, in the organic EL device 1 of the present preferred embodiment, as shown in FIG. 1, the metal layer 2 which functions as the cathode and the light-reflective layer is firstly formed on the substrate 5, so that in its lamination structure, the order of the device formation is opposite to the normal order of the device formation. That is to say, the second electrode layer 4 which functions as the anode is formed after forming the organic layer 3. According to the above configuration, there is no possibility that the organic layer 3 is damaged by the surface roughness of the second electrode 4, so that the short circuit can be suppressed efficiently. Moreover, reliability of a device in which the organic EL device 1 is incorporated can be enhanced.

A band-like sheet member which is made up of a flexible material and fed in a state of being wound in a roll shape can also be used as the substrate 5. In this case, the metal layer 2 is formed on the band-like substrate 5, and the organic layer 3 is continuously formed on the metal layer 2 by a slit coater or the like, and furthermore, the second electrode layer 4 is formed by screen printing or the like at regular intervals. After the formation, the substrate 5 is wound in a roll shape again and collected. According to the above configuration, a light emitting sheet roll (not shown) in which the plural organic EL devices 1 are continuously formed can be made by a so-called roll-to-roll process. Subsequently, when the light emitting sheet roll is cut at predetermined intervals, the plural organic EL devices 1 can be manufactured in a short time. In particular, in recent years, the organic layer 3 tends to be multilayered, for example, the light emitting layer 31 are formed as multiple layers, and electric charge adjusting layers are arranged therebetween. The formation of the organic layer 3 by the roll-to-roll process allows many organic layers made up of multiple layers as described above to be simultaneously manufactured, and a process cost can be reduced.

When the respective organic layers 3 are laminated by the coating process as described above, the organic layer 3 (for example, the hole transport layer 32) formed on the upper side sometimes dissolves the base organic layer 3 (for example, the light emitting layer 31). Moreover, a coating solution for laminating a next layer does not sometimes spread uniformly on a certain organic layer 3 by reason that the wettability of the organic layer 3 is low, for example. Thus, in the present preferred embodiment, it is preferable to make the film thickness of the earlier layer thicker than an aimed film thickness taking into account, in advance, a total amount of dissolution caused by forming the next layer, for example. Moreover, it is preferable to add a solvent (alcohol or the like) which enhances the wettability to the coating solution to improve the wettability.

Next, an organic electroluminescence device (abbreviated as the organic EL device hereinafter) according to a second preferred embodiment of the present invention is described with reference to FIG. 2. The organic EL device 1 of the present preferred embodiment has the metal layer 2 as the substrate to form the organic layer 3. That is to say, the function of the substrate 5 in the above first preferred embodiment is incorporated in the metal layer 2. Moreover, the unevenness 2' is formed on one surface of the metal layer 2 by the method similar to that of the above first preferred embodiment. The other configuration is similar to that of the above first preferred embodiment.

According to the above configuration, the metal layer 2 functioning as the first electrode layer (cathode) is exposed, so that an electrode taking-out unit to which a wiring for power feeding or the like is connected can be set up in any area of the metal layer 2. Moreover, when a flexible metal such as a metal foil is used for the metal layer 2 (substrate), a sealing equivalent to a barrier film can be achieved at a lower price than the barrier film, so that a manufacturing cost can be reduced significantly. When the flexible metal is used for the metal layer 2 (substrate), it is applicable to form a nano-order-sized uneven structure on a wind-up roll and pass the flexible metal layer 2 on the wind-up roll as a method of forming the unevenness 2' on the surface of the metal layer 2. In this way, the unevenness 2' can be formed on the surface of the metal layer 2 easily.

Next, an organic electroluminescence device (abbreviated as the organic EL device hereinafter) according to a third preferred embodiment of the present invention is described with reference to FIG. 3. In the organic EL device 1 of the present preferred embodiment, an insulating layer 8 and a first electrode layer 9 are located on one surface side of the metal layer 2, and the metal layer 2 is located on the substrate 5. The second electrode 4 is located on one surface of the organic layer 3 opposite to the surface of the organic layer 3 which contacts the electrode layer 9. The metal layer 2 has light reflectivity and the first electrode layer 9 has translucency. That is to say, in the present preferred embodiment, the metal layer 2 functions as the light reflection layer and the first electrode layer 9 functions as the cathode which applies a voltage to the organic layer 3. Moreover, in the same manner as the above first preferred embodiment, the unevenness 2' is formed on one surface of the metal layer 2, however, the first electrode layer 9 is located across the insulating layer 8, so that the height of the unevenness 9' of the first electrode layer 9 is smaller than that of the unevenness 2' of the metal layer 2. The other configuration is similar to that of the above first preferred embodiment.

According to the above configuration, the height of the unevenness 9' of the first electrode layer 9 is smaller than that of the unevenness 2' of the metal layer 2, so that the short circuit can be suppressed more reliably. Since the first electrode 9 has the translucency, light which is outputted toward the first electrode layer 9 in light which is emitted by the light emitting layer 31 passes through the first electrode layer 9 and enters the metal layer 2. At this time, the nano-order-sized unevenness 2' is provided on the metal layer 2, so that the surface plasmon occurred on the surface of the metal changes to the propagation light, and thus the light loss caused by the surface plasmon can be suppressed and the efficiency of extracting the light out of the device can be enhanced.

WORKING EXAMPLE

Next, a working example of the above preferred embodiment is particularly described by comparing the working example with a comparison example.

Working Example 1

The working example 1 corresponds to the organic EL device 1 according to the first preferred embodiment shown in FIG. 1. An alkali-free glass plate of 0.7 mm thick (No. 1737 manufactured by Corning Incorporated) is used for the substrate 5. Polymethylmethacrylate (PMMA), which is a thermoplastic resin, is applied to the substrate 5. Subsequently, the substrate 5 with the PMMA is heated to a temperature of 105 degrees Celsius or more, which is a glass-transition temperature of the PMMA, and pressed by a mold, in which triangular grooves having depth of 50 nm and pitch of 200 nm are funned, and after cooling, the mold and the substrate 5 are separated from each other. In this way, the pattern of the mold is transcribed to the resin, and the microscopic unevenness 6 which has the configuration of the triangular grooves having the depth of 50 nm and the pitch of 200 nm is formed on the substrate 5.

Aluminum 80 nm of thick is laminated on the substrate 5, on which the unevenness 6 is formed, as the metal layer 2, by the vacuum deposition method to make the cathode. At this time, when a surface of the cathode is seen through an atomic force microscope (AFM), the formation of the microscopic unevenness 2' which has the configuration of the triangular grooves having the depth of 50 nm and the pitch of 200 nm is confirmed.

Next, a solution which is made by dissolving a red emitting polymer ("Light Emitting Polymer ADS111RE" manufactured by American Dye Source, Inc.) of 1 wt % in tetrahydrofuran (THF) solvent is applied to the metal layer 2 (cathode) by the spin coater so as to have a film thickness of 200 nm and subsequently baked at 100 degrees Celsius for ten minutes, and the light emitting layer 31 is obtained. Subsequently, a solution which is made by dissolving TFB (Poly[(9,9-dioctylfluorenyl-2,7-diyl)-co-(4,4'-(N-(4-sec-butylphenyl)) diphenylamine)]; manufactured by American Dye Source, Inc. "Hole Transport Polymer ADS259BE") of 1 wt % in the THF solvent is applied to the light emitting layer 31 by the spin coater so as to have a film thickness of 12 nm, and thus a TFB coating is made. Subsequently, the substrate 5 is baked at 200 degrees Celsius for ten minutes, and the hole transport layer 32 is obtained. Subsequently, a solution which is made by mixing one part Polyethylenedioxythiophene/polystyrenesulfonate (PEDOT—PSS: manufactured by H. C. Starck—V TECH Ltd., "Baytron P AL4083", PEDOT:PSS=1:6) with one part isopropyl alcohol is applied to the hole transport layer 32 by a spin coater so that a film thickness of the PEDOT-PSS is 30 nm. Then, the hole transport layer 32 is baked at approximately 150 degrees Celsius for ten minutes, and the hole injection layer 33 is obtained. Furthermore, a solution which is made by mixing methyl cellulose (60SH; manufactured by Shin-Etsu Chemical Co., Ltd.) of 5 wt % in ITO nano-sized particles (particle diameter: approximately 40 nm, manufactured by C.I. Kasei company, Limited; ITCW 15 wt %-G30) is pattern-formed using a screen printer so as to have a film thickness of 300 nm, and subsequently dried at 120 degrees Celsius for fifteen minutes to manufacture the organic EL device 1.

Working Example 2

Figure 2:
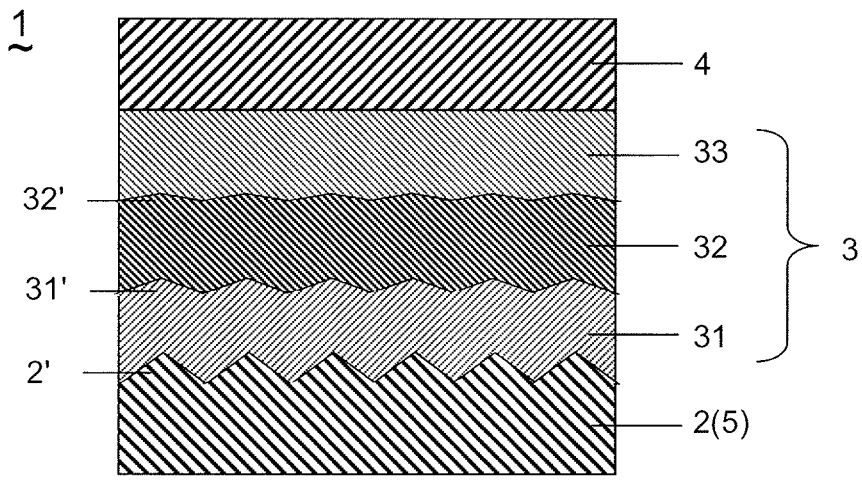
FIG. 2 is a side sectional view of an organic electroluminescence device according to a second preferred embodiment of the present invention.

The working example 2 corresponds to the organic EL device 1 according to the second preferred embodiment shown in FIG. 2. An aluminum foil (approximately 30 μm thickness) is used as the metal layer 2 (substrate), and the mold which is the same with that of the working example 1 is pressed on a smooth surface side to form the microscopic unevenness 2' which has the same configuration of the triangular grooves with that of the working example 1. The other configuration is similar to that of the working example 1 and thus the organic EL device 1 is manufactured.

Working Example 3

Figure 3:
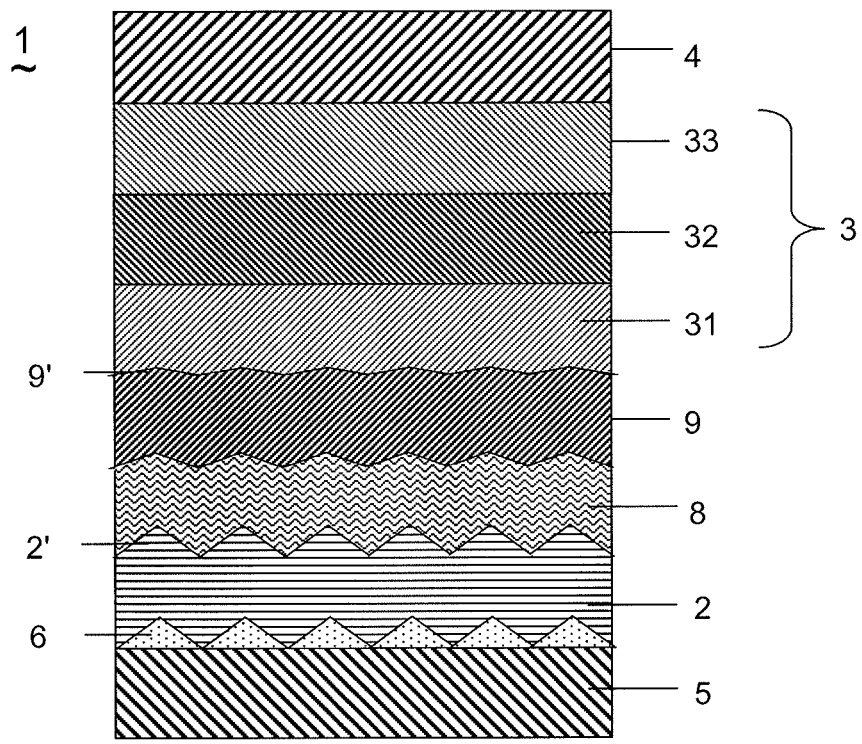
FIG. 3 is a side sectional view of an organic electroluminescence device according to a third preferred embodiment of the present invention.

The working example 3 corresponds to the organic EL device 1 according to the third preferred embodiment shown in FIG. 3. An alkali-free glass plate of 0.7 mm thick (No. 1737 manufactured by Corning Incorporated) is used for the substrate 5. Polymethylmethacrylate (PMMA), which is a thermoplastic resin, is applied to the substrate 5. Subsequently, the substrate 5 with the PMMA is heated to a temperature of 105 degrees Celsius or more, which is a glass-transition temperature of the PMMA, and pressed by a mold, in which triangular grooves having depth of 50 nm and pitch of 200 nm are formed, and after cooling, the mold and the substrate 5 are separated from each other. In this way, the pattern of the mold is transcribed to the resin, and the microscopic unevenness 6 which has the configuration of the triangular grooves having the depth of 50 nm and the pitch of 200 nm is formed on the substrate 5. Subsequently, aluminum of 80 nm thick is laminated on the substrate 5, on which the unevenness 6 is formed, to form the metal layer 2 as a reflection layer, by the vacuum deposition method, and moreover, the PMMA of 100 nm thick is applied to it and hardened to form the insulating layer 8. Furthermore, IZO of 100 nm thick is formed on the insulating layer 8 by the sputtering method to make the first electrode layer 9 (the first electrode layer). The organic layer 3 and the second electrode 4 are manufactured in the same manner as the working example 1, and thus the organic EL device 1 is manufactured.

Comparison Example 1

An alkali-free glass plate of 0.7 mm thick (No. 1737 manufactured by Corning Incorporated) is used as the substrate. Aluminum of 80 nm thick is laminated on the substrate to make the cathode by the vacuum deposition method without forming the unevenness 6 having the configuration of the triangular grooves. The other configuration is similar to that of the working example 1 and thus the organic EL device is manufactured.

Comparison Example 2

An aluminum foil (approximately 30 μm thickness) is used as the substrate, and the light emitting layer 31 is formed on a smooth surface of the substrate without a mold press. The other configuration is similar to that of the working example 2 and thus the organic EL device is manufactured.

Comparison Example 3

An alkali-free glass plate of 0.7 mm thick (No. 1737 manufactured by Corning Incorporated) is used as the substrate. Aluminum of 80 nm thick is laminated on the substrate to make the cathode by the vacuum deposition method without forming the unevenness 6 having the configuration of the triangular grooves. The other configuration is similar to that of the working example 3 and thus the organic EL device is manufactured.

(Evaluation)

In the organic EL devices manufactured as the respective working examples and comparison examples, an electrical current having current density of 10 mA/cm$^2$ is applied between the electrodes, and the light emitted to the atmosphere is measured by an integrating sphere. Subsequently, an external quantum efficiency of the light emitted to the atmosphere is calculated in accordance with these measurement results. The external quantum efficiency indicates a ratio of a total number of photons which are emitted to the atmosphere to a total number of electrons injected and recombined in the light emitting layer 31, and the external quantum efficiency of the light emitted to the atmosphere is calculated from an electrical current applied to the organic EL device and an amount of the light emitted to the atmosphere. The external quantum efficiencies of the working examples 1 to 3 and the comparison examples 1 to 3 are calculated, and each ratio of the working example 1 to the comparison example 1, the working example 2 to the comparison example 2, and the working example 3 to the comparison example 3 is indicated in a table 1.

TABLE 1

|  | Configuration to first electrode | Ratio of external quantum efficiency at 10 mA/cm$^2$ | Current value at 2 V (mA) |
|---|---|---|---|
| Working Example 1 | Glass substrate/unevenness/Al (uneven) | 1.26 | $3.5 \times 10^{-7}$ |
| Working Example 2 | Metallic foil (uneven) | 1.31 | $5.8 \times 10^{-7}$ |
| Working Example 3 | Glass substrate/unevenness/Al (uneven)/PMMA/IZO | 1.22 | $4.0 \times 10^{-7}$ |
| Comparison Example 1 | Glass substrate/Al (flat) | 1.00 | $3.6 \times 10^{-7}$ |
| Comparison Example 2 | Metallic foil (flat) | 1.00 | $6.0 \times 10^{-7}$ |
| Comparison Example 3 | Glass substrate/Al (flat)/PMMA/IZO | 1.00 | $3.9 \times 10^{-7}$ |

As indicated in the table 1, the working examples 1 to 3 exceed in the ratio of external quantum efficiency in comparison with the comparison examples 1 to 3, respectively. Moreover, each current value at a time of applying the voltage of 2V is substantially equal when comparing the working example 1 and the comparison example 1, the working example 2 and the comparison example 2, and the working example 3 and the comparison example 3, thus it is confirmed that in the working examples 1 to 3, the short circuit is suppressed in spite of the formation of the unevenness 2' on the surface of the metal layer 2.

That is to say, when the nano-order unevenness 2' is provided on one surface of the metal layer 2 and the organic layer 3 or the like is laminated on it, the surface plasmon occurred on the surface of the metal layer 2 changes to the propagation light, and thus the light loss caused by the surface plasmon can be suppressed. In other words, even when the metal material is used for the electrode layer or the light reflection layer, the light entering the surface of the metal material is difficult to lose by the surface plasmon, and most of the light is reflected toward the other side and taken to the outside of the device, so that the light extraction efficiency is enhanced. Moreover, each unevenness at the respective interfaces in the respective organic layers 3 is made smaller than the unevenness 2' on the metal layer 2, so that the short circuit inside the device can be suppressed.

The present invention is not limited to the configuration of the above preferred embodiment, as long as the plural organic layers 3 are provided on one surface side of the metal layer 2 on which the nano-order-sized unevenness 2' is provided, and the height of each unevenness at the respective interfaces in the organic layer 3 is made smaller than the unevenness 2' provided on the metal layer 2. For example, a light extraction layer in which particles for enhancing the light extraction efficiency are dispersed may also be formed in a direction of extracting the light in the light emitting layer 31.

The present application is based on Japanese Patent Application 2011-065055, and the content there of is incorporated herein by reference to the specification and the drawings of the above patent application.

DESCRIPTION OF THE NUMERALS 1 organic EL element
2 first electrode (or reflection layer)
2' unevenness
3 organic layer
31 light emitting layer
31' unevenness
32 organic layer (hole transport layer)
32' unevenness
33 organic layer (hole injection layer)
4 second electrode layer
5 substrate
6 unevenness
8 insulating layer
9 first electrode layer
9' unevenness

What is claimed is:
1. An organic electroluminescence device, comprising:
a metal layer which is provided with a nano-order-sized unevenness on one surface;
plural organic layers which include a light emitting layer and are laminated on a side of the one surface of the metal layer; and
an electrode layer provided on an opposite side of the plural organic layers with respect to the metal layer,
wherein
each interface between the plural organic layers has an unevenness, a height of the interface unevenness being smaller than a height of the unevenness of the metal layer, an interface between the electrode layer and an organic layer of the plural organic layers contacting the electrode layer is flat.

2. The organic electroluminescence device according to claim 1, wherein
the unevenness of the metal layer has a height of 10 to 200 nm and a width larger than the height of the unevenness.

3. The organic electroluminescence device according to claim 1, wherein
the metal layer is a first electrode layer which applies a voltage to the plural organic layers, and the electrode layer is a second electrode layer.

4. The organic electroluminescence device according to claim 1, wherein
the metal layer is a substrate, on which the plural organic layers are provided.

5. The organic electroluminescence device according to claim 1, wherein
the plural organic layers are provided on a side of the one surface of the metal layer, the plural organic layers and the metal layer sandwiching an insulating layer and a first electrode layer, which applies a voltage to the plural organic layers.

6. The organic electroluminescence device according to claim 5, wherein
the metal layer has light reflectivity and the first electrode layer has translucency.

7. The organic electroluminescence device according to claim 3, wherein
a height of unevenness at a first interface between the plural organic layers is smaller than a height of unevenness at a second interface between the plural organic layers, the first interface being closer to the second electrode layer than the second interface.

8. The organic electroluminescence device according to claim 3, wherein
the plural organic layers or the second electrode layer is of a coating material.

* * * * *